(12) United States Patent
Heyke

(10) Patent No.: US 7,851,870 B2
(45) Date of Patent: Dec. 14, 2010

(54) MONOLITHICALLY INTEGRATED SEMICONDUCTOR ASSEMBLY HAVING A POWER COMPONENT AND METHOD FOR PRODUCING A MONOLITHICALLY INTEGRATED SEMICONDUCTOR ASSEMBLY

(75) Inventor: Klaus Heyke, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 112 days.

(21) Appl. No.: 11/921,622

(22) PCT Filed: Apr. 27, 2006

(86) PCT No.: PCT/EP2006/061871

§ 371 (c)(1),
(2), (4) Date: Mar. 6, 2009

(87) PCT Pub. No.: WO2006/133995

PCT Pub. Date: Dec. 21, 2006

(65) Prior Publication Data

US 2009/0206419 A1    Aug. 20, 2009

(30) Foreign Application Priority Data

Jun. 14, 2005    (DE) .................... 10 2005 027 366

(51) Int. Cl.
*H01L 27/16* (2006.01)

(52) U.S. Cl. ............... 257/379; 438/469; 324/765
(58) Field of Classification Search ............... 257/379, 257/E21.498, E27.016
See application file for complete search history.

(56) References Cited

U.S. PATENT DOCUMENTS 5,654,863 A * 8/1997 Davies ................ 361/111
5,770,947 A * 6/1998 Brauchle ............. 324/765

FOREIGN PATENT DOCUMENTS

DE    43 34 856    5/1995
DE    44 26 307    2/1996

OTHER PUBLICATIONS

Aitken, R.C. "Test generation and fault modeling for stress testing" Quality Electronic Design, 2002, Proceedings. International Symposium on Mar. 18-21, 2002, Piscataway, NJ, USA, Mar. 18, 2002, S. 96-99, XP010589340.

* cited by examiner

*Primary Examiner*—Thomas L Dickey
(74) *Attorney, Agent, or Firm*—Kenyon & Kenyon LLP

(57) ABSTRACT

A monolithically integrated semiconductor assembly having a power component, and a method for manufacturing a semiconductor assembly, are proposed, a monolithically integrated resistor element being provided between a first terminal and the second region, and a comparatively low-impedance electrical connection through the first region being provided between the resistor element and the second region.

16 Claims, 2 Drawing Sheets

MONOLITHICALLY INTEGRATED SEMICONDUCTOR ASSEMBLY HAVING A POWER COMPONENT AND METHOD FOR PRODUCING A MONOLITHICALLY INTEGRATED SEMICONDUCTOR ASSEMBLY

FIELD OF THE INVENTION

The present invention proceeds from a monolithically integrated semiconductor assembly and a method.

BACKGROUND INFORMATION

German Unexamined Application DE 43 34 856 A1 discusses an assembly for testing a gate oxide of a power component in which, despite the presence of a circuit that is monolithically integrated together with the power component, it is possible to check the gate oxide quality with a superelevated gate test voltage. Provision is made, for this purpose, for a series circuit made up of a first measurement pad, a resistor, and a second measurement pad to be disposed between the gate oxide of the power component and the integrated circuit.

In semiconductor assemblies having monolithically integrated power components, it is possible for terminals, for example a gate terminal of a MOS power transistor, to be interrupted, or for control to be lost (floating-gate state). It can happen in such a case that the power component goes into its maximum-output state, in particular when the source-drain voltage is above a threshold value. This results in failures of the power component and of the entire semiconductor assembly, which can lead to serious problems and consequential damage, in particular when the power component and the semiconductor assembly containing it are disposed in a safety-critical component of a vehicle, in particular a motor vehicle. At the same time, however, it must be guaranteed that the possibly interrupted terminal is checkable in terms of its operating reliability, especially as to whether, in the case of a gate terminal or a gate oxide connected to the gate terminal, sufficient quality (i.e. sufficient voltage resistance) exists for the entire service life of the power component.

SUMMARY OF THE INVENTION

The monolithically integrated semiconductor assembly according to the present invention and the method for manufacturing a monolithically integrated semiconductor assembly having the features of the coordinated claims have, in contrast, the advantage that with arrangement, testability of a first region of the semiconductor assembly is enabled, and it is also nevertheless possible to ensure that the first terminal of the power component exhibits, in guaranteed fashion, a potential that does not result in destruction of the component or in destruction of further components of the vehicle. Upon an interruption of a gate terminal that can be brought about e.g. by a bond break, or also in the event control is lost over a gate terminal of a power component (in particular of a MOSFET transistor), such a power component can transition into the maximum-output state. One approach to preventing this would be to provide a resistor between the gate terminal and source terminal of the MOSFET transistor.

If such a resistor were already introduced upon manufacture of the semiconductor assembly, it would not be possible to test the gate oxide (or the dielectric disposed at the gate terminal) of the MOSFET transistor in reliable fashion, since a disruption of the gate oxide can no longer be reliably detected because too great a current would flow through the resistor, so that the small currents flowing through the dielectric layer and requiring detection in the context of a gate oxide test would be concealed. It was entirely surprising to one skilled in the art that it is possible to achieve both goals with a simple arrangement by the fact that although a resistor structure in the form of a resistor element is provided between the first terminal and the second region of a power component, such a resistor element nonetheless initially performs no function, but instead is subsequently connected, through the first region, to the second region. This is possible, in a manner preferred according to the exemplary embodiments and/or the exemplary methods of the present invention, by way of a first and a second subregion of the first region, the first region being degenerated in its second subregion. This is accomplished, in a manner preferred according to the exemplary embodiments and/or the exemplary methods of the present invention, by applying a voltage pulse. A low-impedance subregion that puts the resistor element into operation is thereby produced in a second subregion of the first region, i.e. inside the dielectric layer.

This behavior can be achieved with a monolithically integrated resistor element that is provided between the first terminal and the second region, a comparatively low-impedance electrical connection through the first region being provided between the resistor element and the second region in the second subregion of the first region. It is advantageous that a comparatively low-impedance electrical connection of this kind can be brought about with a simple arrangement even after the actual manufacture of the semiconductor assembly or the power component, in particular with an overvoltage pulse. It is further preferred that in the first subregion, the first terminal be provided on one side of the first region, and a channel zone be provided on the other side of the first region, so that advantageously and with a simple arrangement, a MOSFET power transistor can be used as a power component. It is furthermore preferred that adjacently to the second subregion, a contact surface, for example a measurement pad, be provided for a further terminal.

The overvoltage pulse or spike can thereby be introduced with a simple arrangement, so that on the one hand comparatively little effort needs to be exerted in order to introduce the overvoltage pulse, and on the other hand effective protection of the remaining regions of the semiconductor assembly is guaranteed. It is further preferred that the power component be a MOS power transistor, in particular a vertical MOS power transistor. This makes it possible, in particularly economical fashion, to build on existing fabrication technology in order to manufacture the semiconductor assembly according to the present invention. It is further preferred that the first terminal correspond to the gate terminal of the power component, and that the second terminal correspond to the source terminal. It is furthermore additionally preferred that the first region be a semiconductor oxide layer, in particular a silicon oxide layer. This allows a layer of a dielectric to be manufactured in particularly reliable and economical fashion using established process technology, so that the semiconductor assembly according to the present invention meets service-life requirements for the intended application, in particular in the automotive sector.

A further subject of the exemplary embodiments and/or the exemplary methods of the present invention is a method for manufacturing a monolithically integrated semiconductor assembly according to the present invention, the semiconductor assembly firstly being substantially completely manufactured, in particular the power component being substantially completely manufactured; in a second step, the second subregion of the first region being generated in such a way that the second subregion is low-impedance. It is optionally possible to provide, between the first step and the second step, a test of the first region in such a way that semiconductor assemblies whose first region does not achieve the required specifications are discarded.

An exemplary embodiment of the invention is depicted in the drawings and is further explained in the description below.

DETAILED DESCRIPTION

Figure 1:
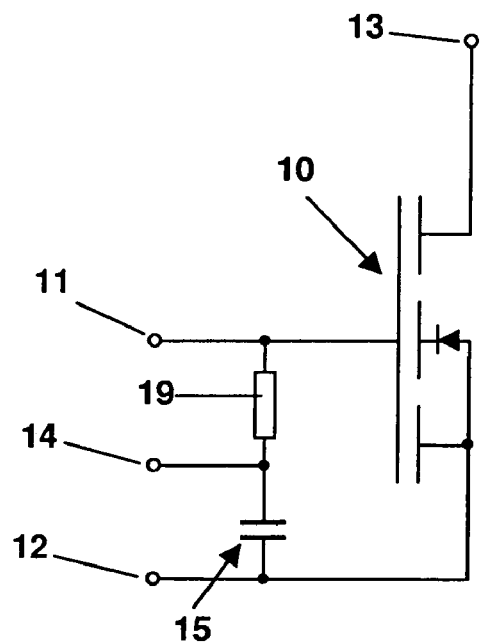
FIG. 1 shows a schematic circuit diagram of a semiconductor assembly, after the first step and before the second step of the method according to the present invention for manufacturing the semiconductor assembly.

FIG. 1 depicts a schematic circuit assembly of a semiconductor assembly. The semiconductor assembly encompasses a power component 10 that is designed in particular as a power transistor 10, in particular as a MOSFET transistor or power MOS transistor. Power component 10 has a first terminal 11, a second terminal 12, and a third terminal 13. The exemplary embodiments and/or the exemplary methods of the present invention is presented on the basis of a MOSFET power transistor as an example of a power component 10. This is to be understood, however, only as exemplary. According to the exemplary embodiments and/or the exemplary methods of the present invention, other types of power components, for example thyristors or the like, which if applicable can also have more than three terminals, can be utilized according to the exemplary embodiments and/or the exemplary methods of the present invention. A resistor element 19 is disposed according to the present invention between first terminal 11 and a second region (not depicted in FIG. 1) of power component 10. The second region is electrically connected to second terminal 12, thereby resulting, in the circuit depiction in FIG. 1, in an electrically insulating region between resistor element 19 and second terminal 12, i.e. disposed between resistor element 19 and second terminal 12 is a first region 15 of power component 10 that initially separates resistor element 19 electrically from second terminal 12 and is provided substantially in the form of a capacitor. A further terminal 14 is also depicted in FIG. 1 between resistor element 19 and second terminal 12.

Figure 2:
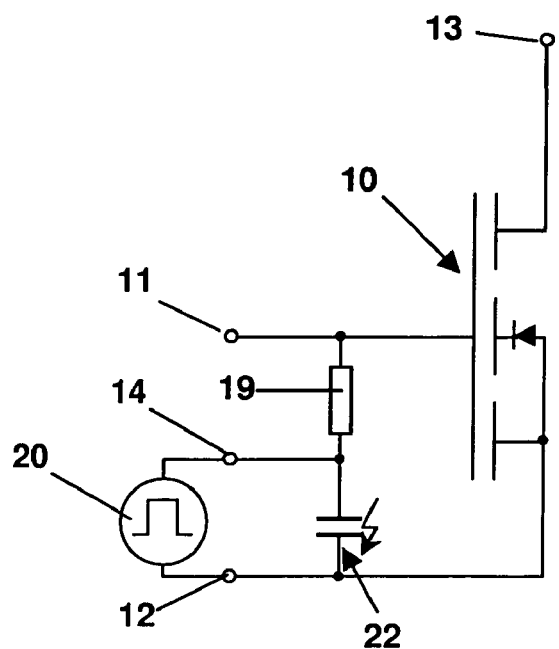
FIG. 2 shows a schematic diagram of the semiconductor assembly according to the present invention, after the second step of the method for manufacturing the semiconductor assembly.

FIG. 2 depicts the schematic disposition of the semiconductor assembly according to the present invention, power component 10 once again having first terminal 11, second terminal 12, and third terminal 13. Power component 10 once again also has resistor element 19. It is apparent from FIG. 2 that with the aid of an overvoltage pulse 20 applied between second terminal 12 and a further terminal 14, first region 15 (cf. FIG. 1) can be degenerated in a subregion in such a way that an electrically low-impedance connection is created between resistor element 19 and second terminal 12. This is depicted in FIG. 2 by a lightning-bolt symbol on capacitor structure 22. The reference character 22 designates, in this case, a second subregion of first region 15 that has become low-impedance as a result of overvoltage pulse 20.

Figure 3:
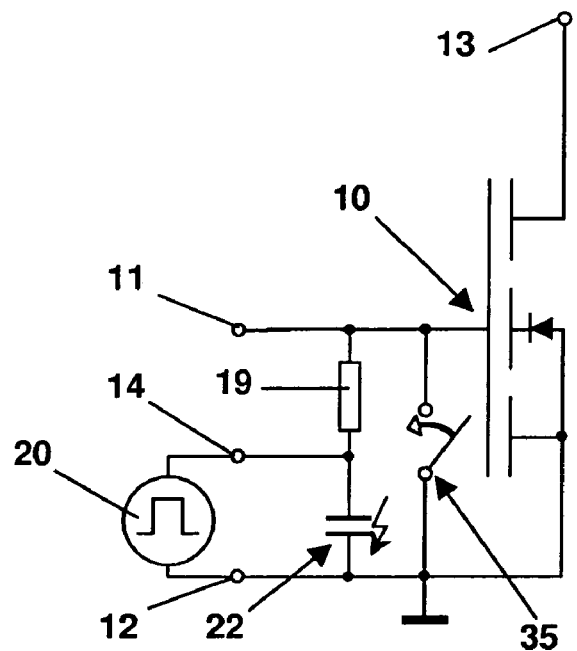
FIG. 3 shows a schematic diagram of a further embodiment of the semiconductor assembly according to the present invention.

FIG. 3 is a schematic circuit depiction of the semiconductor assembly in an alternative embodiment(s). Power component 10 once again has first terminal 11, second terminal 12, third terminal 13, and further terminal 14. In FIG. 3, resistor element 19 and second subregion 22 of first region 15 are disposed between first terminal 11 and second terminal 12, voltage pulse 20 causing second subregion 22 to be degenerated to low resistance. In order to protect power component 10, a short circuit can furthermore be created between first terminal 11 and second terminal 12 during overvoltage pulse 20, as depicted in FIG. 3 with an indicated switch 35.

Figure 4:
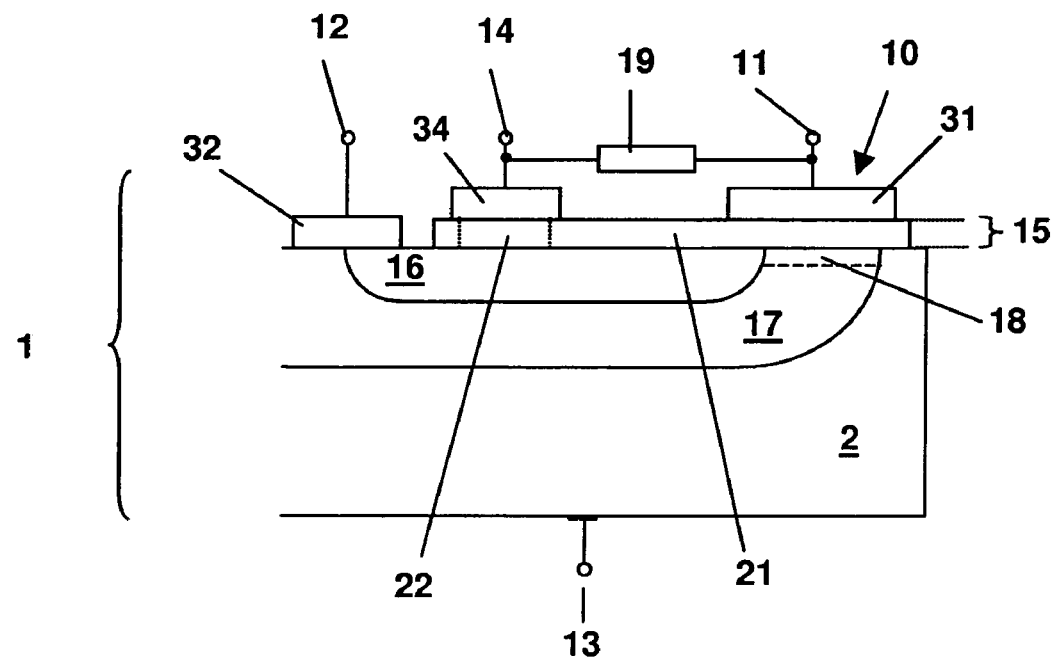
FIG. 4 schematically depicts the construction of the monolithically integrated semiconductor assembly according to the present invention.

FIG. 4 schematically depicts monolithically integrated semiconductor assembly 1 according to the present invention having power component 10, in a sectioned depiction. According to the exemplary embodiments and/or the exemplary methods of the present invention, a vertical MOSFET transistor 10, in particular, is provided as power component 10. Such a transistor has, in a substrate material 2, in particular semiconductor material, particularly preferably silicon material, multiple wells or multiple region of different doping. For example, a second (preferably negatively doped) region 16 is disposed inside a third (preferably positively doped) region 17. Above third region 17, first region 15 is embodied in particular in the form of a layer of comparatively high-impedance material, by preference a dielectric material such as, for example, silicon oxide, silicon nitride, semiconductor oxide or nitride in general, or the like. Above first region 15 (which is also referred to as gate oxide 15) in the region of the connection between first region 15 and third region 17, a first terminal surface 31 or first terminal electrode 31 is provided in order to implement first terminal 11.

First terminal electrode 31 is embodied in particular, according to the exemplary embodiments and/or the exemplary methods of the present invention, as a terminal metallization (contact pad). Provided above second region 16 is a second terminal surface 32 that implements second terminal 12. Third terminal 13 of power component 10 is implemented on the back side of substrate material 2, a terminal metallization likewise preferably being provided, according to the exemplary embodiments and/or the exemplary methods of the present invention, in order to implement a terminal electrode.

In known fashion, power component 10 in the form of a MOSFET transistor functions in such a way that a channel 18 forms between second region 16 and substrate material 2 in third region 17 of power component 10, at the point located opposite first terminal 11 (separated by gate oxide 15 or by first region 15). According to the exemplary embodiments and/or the exemplary methods of the present invention, provision is made that in the region of first region 15, preferably above first region 15, resistor element 19 is provided between first terminal 11 and further terminal 14, initially separated electrically from second region 16 by first region 15. According to the present invention, further terminal 14 be implemented by way of a further terminal surface 34 on first region 15. Resistor element 19 is preferably implemented, according to the exemplary embodiments and/or the exemplary methods of the present invention, by way of a polysilicon structure, preferably by way of a meander-shaped polysilicon structure. Other structures for implementing resistor element 19 are, however, likewise possible.

Provision is made that first region 15, i.e. gate oxide 15, initially be continuously intact, i.e. have an insulating effect, both below first terminal 11 and below further terminal 14.

Power component 10 or semiconductor assembly 10 can, in this context, exist or be processed in entirely completed form. Alternatively, it is also possible for the monolithically integrated semiconductor assembly not to be entirely completed yet, but for the regions depicted in FIG. 4 already to exist and also to be at least partially covered by way of passivation layers (not depicted). This is followed, according to the exemplary embodiments and/or the exemplary methods of the present invention, by a step of testing the dielectric in first region 15. This is because dielectric 15 or first region 15 between third region 17 and first terminal 11 is a critical point in terms of the operation of power component 10 over the entire service life of the assembly, which is intended to correspond to the service life of a vehicle, i.e. approximately 10 to 15 years or even more.

The consequence of imperfections or other defects within first region 15 is that the dielectric strength in this region is not sufficiently high, which results—in particular over the course of the service life of the component or the semiconductor assembly—in failures that not only may damage the entire component or the entire semiconductor assembly, but moreover may also cause damage to components connected thereto. According to the exemplary embodiments and/or the exemplary methods of the present invention, resistor element 19 is sufficiently low-impedance that, for example, a bond break at first terminal 11 does not cause a so-called floating gate state to occur, i.e. a state in which first terminal 11 is not at any defined potential. In the case of a resistor element 19 of sufficiently low resistance to perform this function, however, it is the case that a capability for testing first region 15 in order to check the dielectric strength no longer exists to the necessary degree, since the relatively low resistance of resistor element 19 means that too large a current would flow through said resistor element 19 during testing. It must be noted in this context that the testing of first region 15, i.e. the testing of gate oxide 15, is associated with a measurement of picoampere-scale currents flowing through the gate oxide, whereas in the context of the test voltages of up to 60 V that occur, currents several orders of magnitude greater would flow through resistor element 19 alone.

It is therefore proposed according to the exemplary embodiments and/or the exemplary methods of the present invention that resistor element 19 firstly be provided in a manner insulated from second region 16, first region 15 being provided as insulating material. Overvoltage pulse 20 between the two terminals and further terminal 14 makes it possible, according to the exemplary embodiments and/or the exemplary methods of the present invention, to divide first region 15 into first subregion 21 and second subregion 22, the first subregion still having a sufficiently high impedance to guarantee functionality of the component over its entire service life, and second subregion 22 having a sufficiently low impedance to electrically connect resistor element 19 to second terminal 12. The following testing scenario may be presented by way of example: At a test voltage of +/−15 V, the gate oxide currents for an intact gate oxide are, for physical reasons, in the pA range. In a wafer test program, the gate oxide is tested, for example, with a positive and negative maximum gate voltage, in which context the currents that flow must remain below 100 nA in order for the gate oxide to be considered functional and reliable. If the resistance value of resistor element 19 is, for example 15 kilohm, this yields (for an applied voltage of 15 V) a fault current of 1 mA, so that the fault current is in any case four orders of magnitude greater than the maximum permissible current flowing through the gate oxide.

What is claimed is:

1. A monolithically integrated semiconductor assembly, comprising:
   a power component having a first region of a dielectric, and a first terminal in the first region, and having a second region of a doped semiconductor material, and a second terminal in the second region;
   a monolithically integrated resistor element provided between the first terminal and the second region; and
   a comparatively low-impedance electrical connection through the first region between the resistor element and the second region.

2. The semiconductor assembly of claim 1, wherein the first region has a first high-impedance subregion and a second comparatively low-impedance subregion, a degeneration of the electrically insulating property of the first region being provided in the second subregion, the degeneration being brought about by an overvoltage pulse.

3. The semiconductor assembly of claim 2, wherein in the first subregion, the first terminal is provided on one side of the first region, and a channel zone is provided on an other side of the first region.

4. The semiconductor assembly of claim 2, wherein a contact surface for a further terminal is adjacent to the second subregion.

5. The semiconductor assembly of claim 1, wherein the power component is a vertical MOS power transistor.

6. The semiconductor assembly of claim 1, wherein the first terminal corresponds to a gate terminal of the power component, and the second terminal corresponds to a source terminal.

7. The semiconductor assembly of claim 1, wherein the first region is a semiconductor silicon oxide layer.

8. A method for manufacturing a semiconductor assembly, the method comprising:
   providing a power component having a first region of a dielectric, and a first terminal in the first region, and having a second region of a doped semiconductor material, and a second terminal in the second region;
   providing a monolithically integrated resistor element between the first terminal and the second region;
   providing a comparatively low-impedance electrical connection through the first region between the resistor element and the second region, wherein the first region is continuously high-impedance; and
   degenerating a second subregion of the first region so that the second subregion becomes low-impedance, the degeneration being brought about by an overvoltage pulse.

9. A monolithically integrated semiconductor assembly, comprising:
   a power component having a first region of a dielectric, and a first terminal in the first region, and having a second region of a doped semiconductor material, and a second terminal in the second region;
   a monolithically integrated resistor element provided between the first terminal and the second region; and
   a comparatively low-impedance electrical connection through the first region between the resistor element and the second region.

10. The semiconductor assembly of claim 9, wherein the first region has a first high-impedance subregion and a second comparatively low-impedance subregion, a degeneration of the electrically insulating property of the first region being provided in the second subregion and being brought about by an overvoltage pulse.

11. The semiconductor assembly of claim 9, wherein in the first subregion, the first terminal is provided on one side of the first region, and a channel zone is provided on an other side of the first region.

12. The semiconductor assembly of claim 9, wherein a contact surface for a further terminal is provided adjacently to the second subregion.

13. The semiconductor assembly of claim 9, wherein the power component is a vertical MOS power transistor.

14. The semiconductor assembly of claim 9, wherein the first terminal corresponds to a gate terminal of the power component, and the second terminal corresponds to a source terminal.

15. The semiconductor assembly of claim 9, wherein the first region is a semiconductor silicon oxide layer.

16. A method for manufacturing a semiconductor assembly, the method comprising:

providing a power component having a first region of a dielectric, and a first terminal in the first region, and having a second region of a doped semiconductor material, and a second terminal in the second region;

providing a monolithically integrated resistor element between the first terminal and the second region;

providing a comparatively low-impedance electrical connection through the first region between the resistor element and the second region, wherein the first region is continuously high-impedance; and degenerating the second subregion of the first region so that the second subregion becomes low-impedance, the degeneration being brought about by an overvoltage pulse.

* * * * *